US009788465B2

(12) United States Patent
Haas et al.

(10) Patent No.: US 9,788,465 B2
(45) Date of Patent: Oct. 10, 2017

(54) ACTUATOR APPARATUS AND METHOD FOR MANUFACTURING AN ACTUATOR APPARATUS

(75) Inventors: Martin Haas, Oberstenfeld (DE); Jochen Huebl, Schwieberdingen (DE); Roland Mager, Offenau (DE)

(73) Assignee: ROBERT BOSCH GMBH, Stuttgart (DE)

( * ) Notice: Subject to any disclaimer, the term of this patent is extended or adjusted under 35 U.S.C. 154(b) by 772 days.

(21) Appl. No.: 13/316,832

(22) Filed: Dec. 12, 2011

(65) Prior Publication Data
US 2012/0153752 A1    Jun. 21, 2012

(30) Foreign Application Priority Data

Dec. 21, 2010    (DE) .......................... 10 2010 063 683

(51) Int. Cl.
*H02K 11/02*    (2016.01)
*H05K 9/00*    (2006.01)
(Continued)

(52) U.S. Cl.
CPC .......... *H05K 9/0018* (2013.01); *H01H 50/10* (2013.01); *H02K 5/225* (2013.01); *H02K 11/024* (2013.01);
(Continued)

(58) Field of Classification Search
CPC .... H02K 11/04; H02K 11/02; H02K 11/0005; H02K 11/00; H02K 23/66; H02K 11/22;
(Continued)

(56) References Cited

U.S. PATENT DOCUMENTS 3,250,930 A * 5/1966 Hackney et al. ............... 310/71
3,371,147 A * 2/1968 Daubenberger et al. ..... 174/358
(Continued)

FOREIGN PATENT DOCUMENTS

| CN | 201312230 Y | 9/2009 | |
|---|---|---|---|
| DE | 12956 A1 * | 3/1957 | ............. H02K 11/02 |
| DE | 41 32 813 | 2/1993 | |

OTHER PUBLICATIONS

DE 41 32 813 Machine Translation (Applicant-Supplied Foreign Document).*
Certified Translation of DD 12951 A1, Apr. 2014.*

*Primary Examiner* — Thomas Truong
(74) *Attorney, Agent, or Firm* — Norton Rose Fulbright US LLP; Gerard Messina

(57) ABSTRACT

An actuator apparatus is described as having a stator device, a cover device, a contact device and an attenuation device. The stator device and the cover device are joined in such a manner so that a hollow space is formed between the stator device and the cover device. The cover device has an opening, through which the contact device is guided into the hollow space, so that the contact device runs at least partially in the hollow space and at least partially in the cover device. The attenuation device is positioned in the opening in such a manner so that a high-frequency electromagnetic radiation that travels through the opening is more highly attenuated by the attenuation device than the radiation would be attenuated without the presence of the attenuation device.

19 Claims, 3 Drawing Sheets

(51) Int. Cl.
  *H02K 11/026* (2016.01)
  *H01H 50/10* (2006.01)
  *H02K 5/22* (2006.01)
  *B60T 8/36* (2006.01)
  *H02K 7/14* (2006.01)

(52) U.S. Cl.
  CPC ............ *H02K 11/026* (2013.01); *B60T 8/368* (2013.01); *H02K 7/14* (2013.01); *Y10T 29/49009* (2015.01)

(58) Field of Classification Search
  CPC .. H02K 11/024; H02K 11/026; H02K 11/028; H05K 9/0018; H01H 50/10
  USPC .............. 310/72, 89, 71, 68 R; 361/816, 818
  IPC ....................................................... H02K 11/04
  See application file for complete search history.

(56) References Cited

U.S. PATENT DOCUMENTS

| | | | |
|---|---|---|---|
| 4,268,770 A * | 5/1981 | Iwaki et al. .................... 310/72 |
| 4,384,223 A * | 5/1983 | Zelt ............................. 310/68 R |
| 4,501,983 A * | 2/1985 | Schmider ...................... 310/113 |
| 4,656,313 A * | 4/1987 | Moore et al. ................. 174/362 |
| 4,727,274 A * | 2/1988 | Adam et al. .................. 310/239 |
| 4,845,393 A * | 7/1989 | Burgess et al. ................. 310/51 |
| 4,855,533 A * | 8/1989 | Meyer Swantee ............ 174/362 |
| 5,010,264 A * | 4/1991 | Yamada et al. ................. 310/72 |
| 5,313,126 A * | 5/1994 | Forsythe et al. ................ 310/51 |
| 5,545,853 A * | 8/1996 | Hildreth ..................... 174/120 R |
| 5,903,072 A * | 5/1999 | Phillips ........................... 310/51 |
| 6,037,693 A * | 3/2000 | Marth et al. .................. 310/220 |
| 6,245,993 B1 * | 6/2001 | Franey et al. .............. 174/50.56 |
| 6,307,344 B1 * | 10/2001 | Pajak et al. .................. 318/629 |
| 6,810,316 B2 * | 10/2004 | Yokoyama et al. ............ 701/70 |
| 6,838,839 B2 * | 1/2005 | Goto et al. ................... 318/139 |
| 6,888,062 B1 | 5/2005 | Erickson et al. |
| 6,974,489 B2 * | 12/2005 | Behrens et al. .............. 55/385.6 |
| 7,019,425 B2 * | 3/2006 | Langguth et al. ........... 310/68 R |
| 7,429,813 B2 * | 9/2008 | Walter et al. ................. 310/328 |
| 7,755,232 B2 * | 7/2010 | Winkler et al. ................. 310/72 |
| 8,378,538 B2 * | 2/2013 | Silva ............................... 310/72 |
| 2002/0047366 A1 * | 4/2002 | Allendorf et al. .............. 310/72 |
| 2003/0231456 A1 * | 12/2003 | Anthony et al. .............. 361/302 |
| 2007/0278877 A1 * | 12/2007 | Winkler et al. ................. 310/72 |
| 2008/0197723 A1 | 8/2008 | Ichihara et al. |
| 2012/0013226 A1 * | 1/2012 | Stubner et al. ............. 310/68 R |

\* cited by examiner

ACTUATOR APPARATUS AND METHOD FOR MANUFACTURING AN ACTUATOR APPARATUS

RELATED APPLICATION INFORMATION

The present application claims priority to and the benefit of German patent application no. 10 2010 063 683.5, which was filed in Germany on Dec. 21, 2010, the disclosure of which is incorporated herein by reference.

FIELD OF THE INVENTION

The present invention relates to an actuator apparatus and a method for manufacturing an actuator apparatus.

BACKGROUND INFORMATION

Permanently energized, brush-type, direct-current motors may be used for operating the pressure supply unit or pressure supply device in electronic brake systems. Examples of electronic brake control systems include an anti-lock braking system (ABS) or an electronic stability control system (electronic stability control, ESP). The motors in the pressure supply unit may have a stator, in which the permanent magnets are situated.

During operation of these brush-type, direct-current motors, electronic interference may be produced by brush sparking or by so-called fritting. This interference may leave the motor via its electric leads. The fritting may be electric current conduction through a commutator boundary layer. During fritting, an electric current is conducted through the very thin, insulating oxide layer of the commutator lamellae. Brush sparking may occur due to current chopping during the commutation operation. The high current gradients associated with this, as well as the fritting, generate electromagnetic interference.

It may be necessary to render interference suppression possible in a high frequency range.

SUMMARY OF THE INVENTION

The apparatus and method of the present invention, which have the features of the independent claims, may reduce interference, in particular, electromagnetic interference. The interference suppression measures provided in the actuator apparatus allow the attenuation of interference in a high-frequency range. Advantageous further developments and improvements of the apparatus and method specified in the independent claims are rendered possible by the measures listed in the dependent claims.

One aspect of the exemplary embodiments and/or exemplary methods of the present invention relates to an actuator apparatus, which may have a stator device, a cover device, a contact device and an attenuation device. The stator device and the cover device may be joined in such a manner, that a hollow space is formed between the stator device and the cover device. The cover device may have an opening, through which the contact device may be guided into the hollow space, so that the contact device runs at least partially in the hollow space and at least partially in the cover device.

The attenuation device may be positioned in the opening of the cover device in such a manner, that a high-frequency electromagnetic radiation that travels through the opening is more highly attenuated by the attenuation device than the electromagnetic radiation would be attenuated without the presence of the attenuation device. The attenuation device may be situated outside of the hollow space, for example.

With the aid of the attenuation device and, in particular, by the selection of the material used for the attenuation device and/or by the placement of the attenuation device at a position suitable for it, the energy of the electromagnetic radiation may be able to be reduced more markedly along a direction of propagation than would be the case without the presence of the attenuation device. For example, the electromagnetic radiation may be attenuated to a small extent by air that is present; however, this attenuation may not be enough to reduce the energy of the electromagnetic radiation on a path through the cover device, such that after passage of the electromagnetic radiation through the cover device, the radiation present is essentially reduced to such an extent, that other electrical devices in the vicinity are subjected to essentially no interference. The electromagnetic radiation may be spurious electromagnetic radiation. The spurious electromagnetic radiation may travel along the contact device.

According to another aspect of the exemplary embodiments and/or exemplary methods of the present invention, a method for manufacturing an actuator apparatus is specified which includes the joining of a stator device to a cover device. The joining may be such, that a hollow space is formed between the stator device and the cover device. The cover device may be provided with an opening, through which a contact device may be guided into the hollow space. The contact device may be able to be guided through the hollow space in such a manner, that the contact device runs at least partially in the hollow space and at least partially in the cover device.

The method for manufacturing an actuator apparatus may further include the positioning of an attenuation device in the opening. The attenuation device may be positioned in or inside the opening in such a manner, that a high-frequency electromagnetic radiation that may travel through the opening may be more highly attenuated by the attenuation device than the radiation would be attenuated without the presence of the attenuation device.

The attenuation may mean either a removal of energy by dissipation, i.e., conversion into heat, and/or a reduction in the radiated energy by reflection. In the case of reflection, the radiation is reflected back into the motor, where it is partially dissipated and partially reflected again, etc.

According to another exemplary embodiment of the present invention, the attenuation device may be adapted to the stator device and/or the cover device in such a manner, that the attenuation device essentially attenuates the electromagnetic radiation that is blocked off by the stator device and/or by the cover device.

According to a further exemplary embodiment of the present invention, a pressure supply device is described which includes the actuator apparatus of the present invention.

The stator device and/or the cover device may be used as a screen for electromagnetic radiation, so that the radiation that is present inside of the hollow space may, in essence, not arrive outside of the hollow space via the stator device or cover device. Consequently, essentially the only place through which the radiation may arrive outside, i.e., outside of the hollow space, may be the opening in the cover device. For example, the cover device or the stator device may be formed in such a manner, that an electromagnetic radiation of a specific frequency and/or a specific frequency range may not escape from the capsule made up of the cover device and stator device. However, the attenuation device may then be adapted in such a manner, that the radiation of the specific frequency or the specific frequency range that is blocked off by the capsule is attenuated. Thus, the attenuation may be adapted to the shielding effect of the capsule.

The cover device may have further openings, e.g., for pressure lines, but the further openings being able to be essentially formed in such a manner, that propagation of electromagnetic radiation through these openings is substantially prevented.

An aspect of the exemplary embodiments and/or exemplary methods of the present invention is to carry out attenuation outside of the hollow space, in order to employ an attenuation element that may have large dimensions in comparison with the actuator itself. Therefore, a positioning of an attenuation element outside of a hollow space may be described. The actuator, e.g., the motor, and, in particular, the connection leads of the actuator, may be situated essentially in the hollow space or in the capsule. The interference may be focused on essentially a single outlet location, e.g., the opening in the cover device, where it may be attenuated in a controlled manner. Therefore, in spite of a small type of construction of the actuator or the capsule, interference suppression of a high-frequency frequency range may be carried out. For example, the actuator apparatus may belong to a pressure supply unit in an electronic brake control system. Electromagnetic radiation from 200 MHz to 3 GHz or radiation from 20 kHz to 3 GHz may be attenuated by the proposed actuator apparatus, the pressure supply unit or the electric motor, in particular, the housing.

The attenuation element, which is situated in the opening, outside of the hollow space, may be referred to as an interference suppression solution external to the motor. In addition to the solution external to the motor, interference suppression internal to the motor may also take place by using, for example, ferrite beads, ferrite chokes or capacitors inside of the hollow space. Using interference suppression solutions internal to the motor, frequencies up to approximately 200 MHz may be attenuated. The capacitors may be foil capacitors, for example. If suitable ceramic capacitors having a grounded connection favorable for high-frequency engineering are used instead of foil capacitors, then the interference suppression may also function up to higher frequencies, e.g., up to 1 GHz.

Using the interference suppression solution external to the motor, e.g., interference may be suppressed in the entire frequency range of approximately 20 kHz to approximately 3 GHz, or in the frequency range of approximately 200 MHz to approximately 3 GHz, or in the frequency range of approximately 1 GHz to approximately 3 GHz. This may allow, for example, digital services to be used effectively in a motor vehicle. In addition, e.g., new types of antenna systems may be used that extend into the frequency range of approximately 3 GHz. Using an interference suppression solution external to the motor, i.e., an attenuation element situated outside of the hollow space, interference, in particular, electromagnetic interference, which is not taken into account by interference suppression solutions internal to the motor, may be attenuated. Therefore, multi-stage interference suppression may be implementable. An interference suppression solution internal to the motor or an interference suppression solution in the interior of the hollow space may be carried out, using a ferrite choke, a foil capacitor and/or a rod-core inductor. In particular, the rod-core inductor may lose its attenuation effect at higher frequencies, mainly at frequencies over 200 MHz. A rod-core inductor may lose its attenuation effect via a capacitive coupling between its windings. Foil capacitors may lose their attenuation effect via parasitic series inductances. The interference not covered by an internal interference suppression solution may be attenuated by the external interference suppression solution.

In contrast to an internal interference suppression solution, an external interference suppression solution, in particular, when it is provided for motors, may prevent the interference from being recoupled into an existing connection lead after it may have been attenuated beforehand. This could be the case when, between the interference suppression elements and the contacts, e.g., the terminals of the motor contact, high-frequency electromagnetic interference fields are recoupled onto the connection lead, which were essentially removed beforehand by an interference suppression element. Such a situation may occur in a hollow space of a housing, for example, in a motor interior, if the connecting wires between the interference suppression element and terminals of the motor contact are also situated in the interior of the motor and are consequently exposed to electromagnetic interference field both in front of and after the interference suppression measure. Using an attenuation element situated in the opening of the cover device, a separation may be achieved between a side of the cover device subjected to interference, e.g., in the interior of the hollow space, and the outside of the cover device. The outside may be essentially interference-free. Consequently, contact devices or parts or a contact device that are situated on the outside may no longer serve to pick up interference signals.

Using the actuator apparatus, in particular, by positioning the attenuation device outside of the hollow space, an attenuation effect up to very high frequencies may be achieved by a form of implementation of an inductively or capacitively active element that is favorable with regard to high-frequency engineering.

Therefore, the apparatus of the present invention and the method of the present invention, which include the features of the independent claims, may render possible external attenuation and, thus, the use of attenuation elements that are larger in dimension than attenuation elements that could be used in the interior of the hollow space.

Exemplary embodiments of the present invention are illustrated in the drawings and explained in greater detail in the following description.

DETAILED DESCRIPTION

Figure 1:
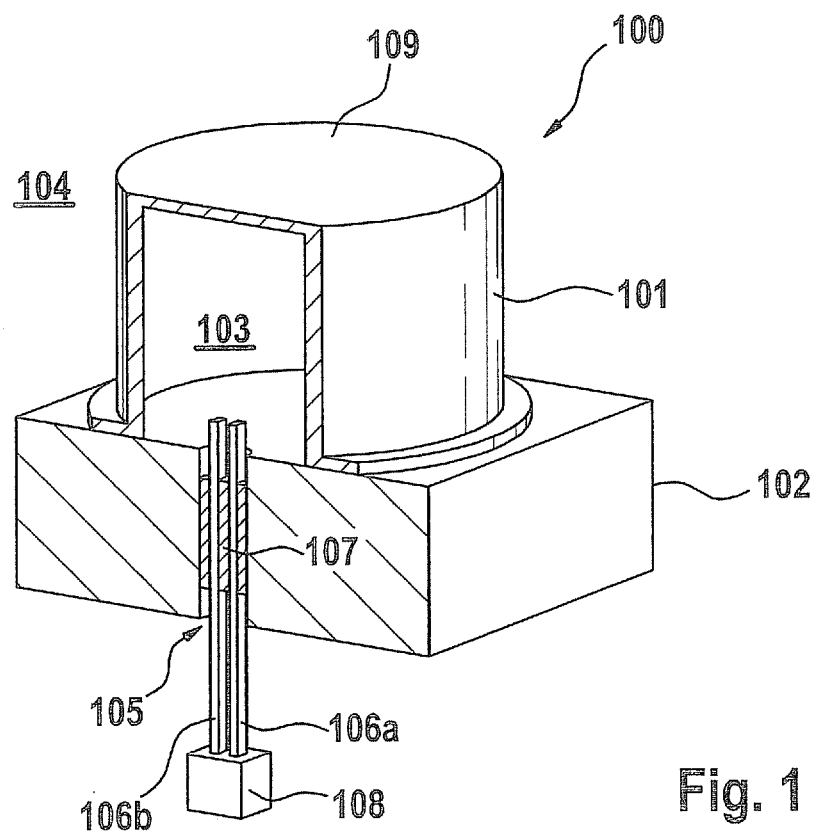
FIG. 1 shows a perspective sectional view of an actuator apparatus having an attenuation device according to an exemplary embodiment of the present invention.

FIG. 1 shows an actuator apparatus 100, which has a pole pot 101 or a stator device 101. Stator device 101 is connected to cover device 102. Actuator apparatus 100 may be a motor 100, in particular, a direct-current motor 100, or a pressure supply unit 100 in an electronic brake control system. Stator device 101 or pole pot 101 has permanent magnets (not shown in FIG. 1). Stator device 101 is made of material, which allows blocking of electromagnetic radiation that is formed in a hollow space 103. Hollow space 103 is formed by attaching stator device 101 to cover device 102. Stator device 101 essentially forms, together with cover device 102, a capsule or a housing in which the components of the motor are accommodated. Thus, the element made out of stator device 101 and cover device 102 may also be referred to as motor 100, although the motor is mainly accommodated in hollow space 103.

Stator device 101 is formed to be tubular, one side of the tube being terminated by a cover 109, while the side opposite to cover 109 is open. This pole pot 101 only open on one side simultaneously constitutes, right down to the open front side, an electric and magnetic shield through which electromagnetic fields essentially cannot escape to the outside 104. Opening 105 is opposite to cover 109, i.e., closed side 109, of stator device 101. In other words, this means that electromagnetic fields, which form in hollow space 103 between pole pot 101 and cover device 102, may essentially not travel through the wall of the pole pot into external space 104. In essence, the only connection of hollow space 103 and external space 104, through which electromagnetic radiation can propagate, is formed by an opening 105 in cover device 102. In addition to opening 105, further openings (not shown in FIG. 1) may be present in cover device 102. However, an electromagnetic radiation may essentially not be able to propagate in the further openings.

Cover device 102 may be made of metal and may also be referred to as A-bearing cover 102. In other words, this may mean that a motor is supported at two points, for example. In the case of the two-point support, the one bearing on the side of the pole pot cover may be referred to as a B-bearing, and the bearing on the side of the pole pot opening may be referred to as an A-bearing. In systems having three-point support, there may additionally be a C-bearing.

In another example of a system 100, the side of the pole pot shown to be open in FIG. 1 may be closed by a bearing cover made of plastic or sheet metal, which then also supports the A-bearing. Such a closure may prevent the motor from falling apart as a component. Such an additional closure is not shown in FIG. 1, since it is not important with regard to EMC.

In an assembled state, cover device 102 forms a closure for the open side of stator device 101. In other words, in an assembled state, stator device 101 may be connected to cover device 102 in such a manner, that cover device 102 substantially covers the open side of stator device 101 and is situated opposite to cover 109 of stator device 101. In an exemplary embodiment of the present invention, the lateral surfaces of opening 105 and of stator device 101 run essentially parallel. In particular, the stator device and/or opening 105 may be cylindrical or tubular. In the case of a cylindrical or tubular design of stator device 101 and of opening 105, longitudinal axes of stator device 101 and of opening 105 run essentially parallel. Cover plate 102 or cover device 102, in particular, the A-bearing cover of the motor not shown in FIG. 1, may include the A-bearing of a motor. Opening 105 may be used as a lead-through 105 for the electrical lead wire of the motor. Therefore, in one exemplary embodiment, actuator apparatus 100 may take the form of a motor 100 or a housing for a motor. Essentially, only housing 100 of the motor is shown in FIG. 1, without going into detail about the further components of the motor.

Lead-through 105 for electrical lead wires 106a, 106b takes the form of opening 105 in cover device 102. In FIG. 1, electrical lead wires 106a, 106b, motor tabs 106a, 106b, motor contact plugs 106a, 106b or electrical contact devices 106a, 106b run at least partially in hollow space 103, in opening 105 and in external space 104. Contact device 106a, 106b is positioned essentially parallel to a longitudinal axis of opening 105. Opening 105 connects interior space 103 or hollow space 103 to external space 104 and may essentially constitute the only connection for electromagnetic radiation between interior space 103 and external space 104.

Although two contact devices 106a, 106b, e.g., a lead-in wire of a motor 106a and an outgoing wire of a motor 106b, are illustrated in FIG. 1, one exemplary embodiment also provides for only one single contact device 106a to run in opening 105. Attenuation device 107 or interference suppression element 107 is illustrated in cover device 102, between hollow space 103 and external space 105. Attenuation device 107 surrounds contact device 106a, 106b and may be simultaneously configured to mechanically seal hollow space 105. FIG. 1 shows the installation of interference suppression element 107 in motor contact lead-through 105.

The pressure supply unit may also be referred to as a hydraulic unit. In other words, the pressure supply unit, which may include the motor, an eccentric bearing and/or pumps, constitutes only a subset of the hydraulic unit. The total hydraulic unit may further include valves, for example, 12 valves, accumulators, filters and other hydraulic components. During assembly of the hydraulic unit, motor 100 is joined to cover device 102, e.g., to an aluminum block 102, by screwing or crimping. Upon joining, care is taken that the open side or A-bearing side of the motor, in particular, the open side of stator device 101 of the motor, is occluded by aluminum block 102 so as to form as much of a surface seal as possible. In one example, cover device 102 may be made of aluminum. In essence, the only existing opening 105 of motor interior 103 or hollow space 103 to the outside 104 is opening 105, which takes the form of a channel 105 in cover device 102.

Electromagnetic interference (RFI, radio frequency interference) may mainly escape from motor interior 103 to the outside 104 via contact device 106a, 106b. In this context, contact device 106a, 106b may act together with opening 105 as a coaxial conductor. Alternatively or in addition to that, opening 105 acts as a waveguide. Thus, the electromagnetic waves are conducted through the opening by the two contacts 106a, 106b. Depending on the frequency, the waves may additionally escape through the hole by so-called diffraction, even without an inner conductor. However, diffraction effects may be negligible in most cases. The contact hole is mainly present for through-contacting.

During the escape, electromagnetic interference would travel from the hollow space in the direction of external space 104. Control unit (ECU, electronic control unit) 108 is placed on the outside of cover device 102, i.e., on the side of aluminum block 102 opposite to motor 100, in particular, opposite to stator device 101. Therefore, via contact device 106a, 106b, electromagnetic interference present in the interior of stator device 101 may reach the control unit 108 placed in external space 104.

All of the electromagnetic interference or all of the spurious electromagnetic emissions of actuator apparatus 100, in particular, of the brake control system, are mainly made up of components that are formed in electronic control unit 108 due to the operation of the electronic circuit itself, and made up of further components that are formed in direct-current motor 100 of the hydraulic unit, i.e., in hollow space 103 of actuator apparatus 100.

According to a design of the total system that is suitable with regard to EMC (electromagnetic compatibility), the arrangement of attenuation device 107 may attenuate the emissions generated in motor 100 as close as possible to the location of their origin. The total system may include electric motor 100 and control unit 108. Since the emissions may mainly be formed in interior 103 of stator device 101, the arrangement and/or the state of attenuation device 107 may be selected in such a manner, that the electromagnetic emissions are attenuated as closely as possible to interior space 103. The type of construction and/or the selected material may contribute to the state of attenuation device 107. The attenuation device may ensure, in particular, that the electromagnetic interference formed in interior space 103 essentially does not come through motor contact opening 105 unattenuated to the outside, in the direction of control unit 108. Attenuation device 107 may have essentially no influence or only a small influence on interference that is generated by control unit 108 during operation.

Attenuation device 107 may be such, that interference frequency ranges of f<200 MHz are attenuated. However, the attenuation device may also be configured to adhere to limiting values in a frequency range of f<3 GHz or f≤3 GHz. In another example, the attenuation device may be configured to adhere to limiting values in a frequency range of 200 MHz≤f<3 GHz.

Predefined EMC requirements may be satisfied in a range of f<200 MHz by installing a Cx capacitor in control unit 108 for series-mode rejection. A so-called Cx may be accommodated both in the interior of the motor and in ECU 108. In motor interior 103, further additional measures may be implemented in order to attenuate frequencies in the range of f<200 MHz For example, two ferrite chokes internal to the motor may be used in motor interior 103 for attenuating spurious emissions in the range of approximately 10 MHz to approximately 150 MHz. In addition, other measures may be included, such as the use of two Cy capacitors for common-mode rejection. A Cy capacitor may be used in the motor or in the motor interior. The insertion of a Cy in ECU 108 is possible but is seldom used, since the connection to the hydraulics ground is often not possible or not suitable. A Cx capacitor is a capacitor or a capacitively acting element, which is formed between two contact devices 106a, 106b. A Cy capacitor is a capacitor or a capacitively acting element, which is formed between a contact device 106a, 106b and a device ground 102. The device ground is a reference potential, for example, at the motor housing.

Interference suppression solutions that are internal to the motor may be used in addition to an attenuation device 107 situated outside of hollow space 103. For example, attenuation measures internal to the motor may be used for selective attenuation of frequencies in a frequency range of less than 200 MHz, and frequencies over 200 MHz may be attenuated by externally situated attenuation device 107. Consequently, multi-stage attenuation may be achieved.

Attenuation device 107 may occlude opening 105 completely or partially; that is, attenuation device 107 may extend either completely or partially over the overall length of an opening 105. FIG. 1 shows an attenuation device 107 extending over a portion of the length of opening 105.

Opening 105 may also be referred to as a motor contact bore 105. Attenuation element 107 or attenuation device 107 is placed in motor contact bore 105 and therefore surrounds motor connection leads 106a, 106b. Therefore, in essence, attenuation element 107 may act directly in the only existing opening 105 to the outside and consequently seal outlet 105 for high-frequency interference, mainly for high-frequency, electromagnetic interference. In the present case, a high-frequency interference may be an electromagnetic radiation in a frequency range of approximately 200 MHz to approximately 3 GHz.

Attenuation element 107 may attenuate propagating electromagnetic interference, that is, it may ensure that the power and/or the energy of the interference decreases in the propagation direction. In particular, the attenuation element may be set up so that it may ensure that along a defined length, an energy of the electromagnetic interference decreases more strongly than if the attenuation element were not present. Thus, electromagnetic interference may be attenuated upon exiting hollow space 103. The attenuating of the spurious emissions inside motor contact lead-through 105 may essentially prevent re-coupling of the interference from occurring after the filtering. In other words, a part of contact device 106a, 106b situated in outer region 104 may, in essence, only be reached by interference present in interior 103 of stator device 101, via attenuation element 107, which means that the part of contact device 106a, 106b situated in outer region 104 is, in essence, not directly reached by the electromagnetic interference from interior 103 of the stator device.

Thus, the emissions basically do not even leave the region of their origin 103 at all in unattenuated form, as would be the case in downstream attenuation in the region of control unit 108. The downstream attenuation may be interference suppression spatially removed from the point of origin of the interference, for example, inside the control unit or the motor contact lead-through.

The screening of hollow space 108 by stator device 101 and by cover device 102 may also prevent radiation from penetrating interior space 103 from the outside 104.

Figure 2:
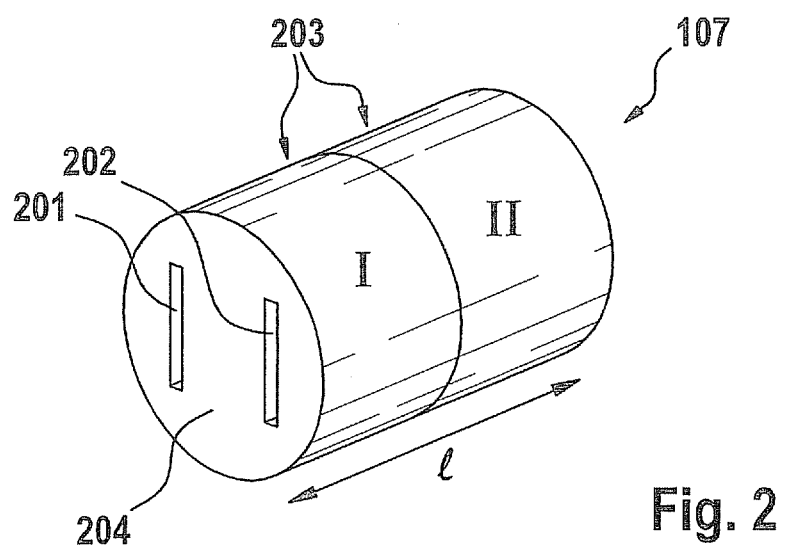
FIG. 2 shows a perspective view of an attenuation device according to an exemplary embodiment of the present invention.

FIG. 2 shows a three-dimensional perspective view of attenuation device 107, interference suppression device 107 or sealing device 107. Attenuation device 107 is cylindrically shaped, in order to be able to seal an opening 105 that is tubularly shaped as a bore 105. Attenuation device 107 is made out of a solid material and has, essentially, only the two contact openings 201, 202 as openings, whose shape is such that a contact device 106a, 106b may be passed through contact openings 201, 202 in an essentially precisely-fitting manner. In the example of FIG. 2, they are two rectangular contact openings 201, 201. However, any other shapes and any other number of contact openings 201, 202 are conceivable. Instead of rectangular conductor cross-sections and, consequently, rectangular contact passages 201, 202 as well, round conductors and round contact passages 201, 202 may also be used.

For example, only one single contact opening or at least three contact openings 201, 202 may also be present. A multitude of contact openings is also conceivable. The diameter of attenuation device 107 is adapted to a diameter of opening 105. Contact device 106a, 106b is surrounded by attenuation device 107 after assembly, which means that contact device 106a, 106b is embedded in attenuation device 107 or is essentially surrounded by attenuation device 107 on all sides. To manufacture it, attenuation device 107 may be cast or sintered. Manufacturing it as a lathed part would also be conceivable. Attenuation device 107 has lateral surface 203. Lateral surface 203 or outer surface 203 may have a screw thread and may be brought into engagement with a corresponding screw thread present in opening 105, in order to produce reliable support in opening 105. However, lateral surface 203 may also be designed as an interference fit, in order to be able to be pressed in opening 105 in a form-locked manner. In order to avoid a direct pressing-in of a mechanically brittle, ceramic part, a ceramic part may be used which, for example, in the form of a contacting area, is surrounded by a suitable sheet metal structure as an outer conductor.

When the seating of attenuation device 107 in opening 105 is mechanically closely lying, attenuation device 107 may also be used to substantially seal hollow space 103 mechanically. Therefore, attenuation device 107 may not only curb the escape of electromagnetic radiation, but also prevent material from mechanically penetrating into or escaping from the hollow space. Attenuation device 107 may be situated between hollow space 103 and control device 108.

Attenuation device 107 may include a plastic-bonded powder mixture and/or a ceramic material. An electrical contact may be present on lateral surface 203, in order to produce a highly conductive connection to cover device 102. Such a contact on lateral surface 203 or on surface 203 may be a metallic layer, a thin-walled sheet, and/or a thin-walled sheet having at least one elastic point contact. In addition, a conductive adhesive may be applied to surface 203; with the aid of the conductive adhesive, the attenuation device being able to be bonded in place in opening 105 and, simultaneously, a conductive contact between cover device 102 and attenuation device 107 being able to be produced.

Corresponding contacts may also be situated at the surfaces of contact passages 201, 202, in order to be able to produce a highly conductive contact with contact device 106a, 106b.

Figure 3:
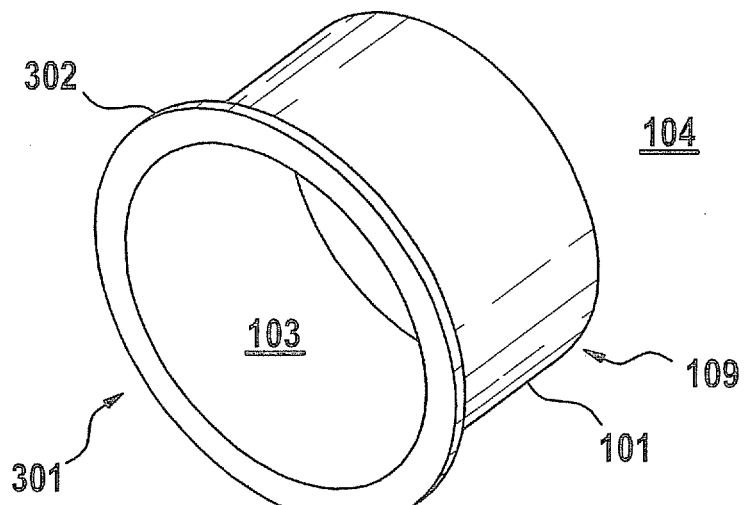
FIG. 3 shows a stator device according to an exemplary embodiment of the present invention.

FIG. 3 shows a perspective bottom view of a stator device 101 according to an exemplary embodiment of the present invention. The stator device includes cover 109, which shields or isolates hollow space 103 both essentially mechanically and essentially electrically from a surrounding area 104. Opening 301, which permits access to hollow space 103, may be seen on the side opposite to the cover. In the region of opening 301, stator device 101 additionally has a flange 302, by which a connection to cover device 102 may be produced by bolting or crimping. Thus, stator device 101 is formed in the shape of a top-hat. Flange 302 has a planar contact surface, with the aid of which it may lie essentially flat on cover device 102. Stator device 101 may be a motor pole pot 101, a pole pot 101 or a stator of an electric motor. Accordingly, hollow space 103 may be an interior space of a motor 103.

Figure 4:
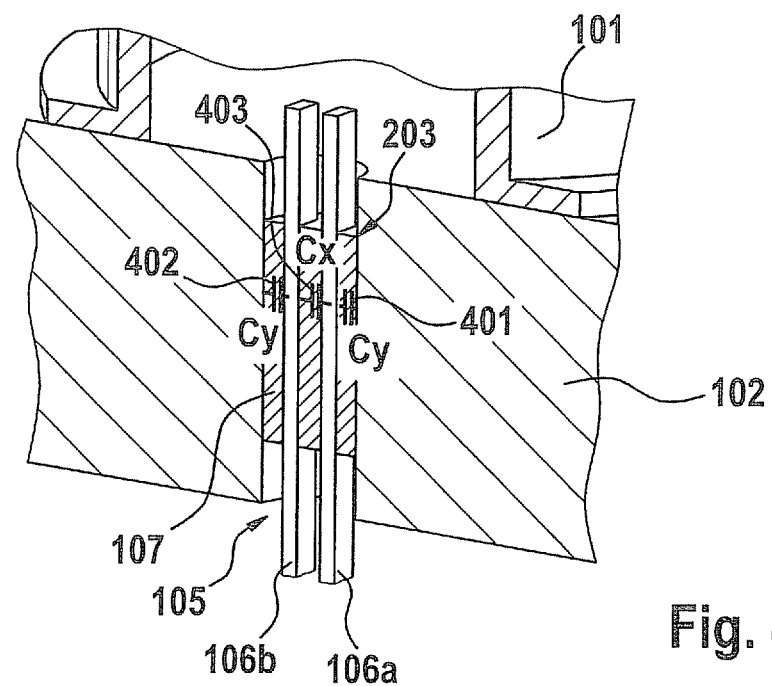
FIG. 4 shows a section out of the sectional view of the actuator apparatus of FIG. 1, according to an exemplary embodiment of the present invention.

FIG. 4 shows a detail view of the mounting of interference suppression element 107 in opening 105. In this connection, it may be seen how a conductive contact with cover device 102 is produced via the contacting at lateral surface 203 of interference suppression element 107. In the same manner, a conductive contact is produced between contact elements 106a, 106b and interference suppression element 107. These contacts form Cy capacitors 401, 402 between contact devices 106a, 106b and cover device 102. Capacitor Cx is formed between the two contact devices 106a, 106b.

Since attenuation element 107 surrounds the two motor contacts 106a, 106b and, at the same time, is essentially in direct contact with the device ground, attenuation element 107 is manufactured to have high resistance. The device ground is formed via cover device 102. The high-resistance construction of attenuation element 107 produces essentially an insulator effect between contact device 106a, 106b and cover device 102. In this context, the high-resistance construction should be manufactured in such a manner, that, in essence, only small and tolerable leakage currents may flow through attenuation device 107. For example, a leakage current $I_{leakage}$ should be $I_{leakage} < 1$ mA.

The magnitude of the maximum permissible leakage currents, which flow between contact device 106, 106b and device ground 102, should not exceed an upper limit or an upper bound. This upper limit is a function of the magnitude of the leakage currents that control device 108 can tolerate. Attenuation device 107 may be considered to provide insulation, if attenuation device 107 can provide a direct electrical current resistance of at least 20 kOhm between contact device 106a, 106b and ground 102.

In the case of the possible attenuation effect of attenuation element 107, one may distinguish between essentially three different physical operating principles, which may be achieved alone or in any combination by attenuation element 107. The different operating principles may be inductive attenuation including the magnetic hysteresis losses, capacitive attenuation, and eddy-current attenuation, i.e., attenuation on the basis of a conductivity. Thus, in different specific embodiments, element 107 may have an attenuating effect on electromagnetic interference. These effects may be achieved through the selection of the material of the attenuation element and/or the structural set-up, in particular, through the type of contacting.

In one example, attenuation element 107 may be manufactured as a magnetically-soft ferrite ceramic. In this specific embodiment, attenuation element 107 has an attenuating effect due to its inductive properties. Examples of magnetically-soft ferrite ceramics may include ferrite beads, which are guided over round conductors. Inside the motor, ferrite beads, which may be manufactured as small ceramic tubes, may be guided over the lead wires and mechanically mounted, for example, by cementing them. Attenuation device 107 according to the present invention may achieve a larger attenuation effect than simple ferrite beads, since in comparison with interference suppression solutions internal to the motor, large dimensions of attenuation element 107 may be realized due to the mounting location's being outside of hollow space 103. For example, length l of attenuation element 107 may be approximately 10 mm to 30 mm. In addition, in comparison with ferrite beads, larger cross-sectional areas of attenuation element 107 may be achieved. For example, cross-sectional area 204 of a cylindrical attenuation device 107 may be $(5 \text{ mm})^2 * \Pi$ when the radius of opening 105 is 5 mm. An attenuation element 107, which is made of magnetically-soft ferrite ceramic and has a large cross-sectional area, may conduct a correspondingly large magnetic flux. Consequently, due to the increased cross-sectional area in comparison with a ferrite bead, the cylindrical attenuation element may conduct a larger magnetic flux than a ferrite bead. By conducting a large flux, attenuation element 107 may provide a high inductance. This high inductance may ensure an effectiveness up to very high motor currents, since magnetic saturation of element 107 is essentially prevented. In one example, a specification for an inductive element reads that the inductive element is not yet in magnetic saturation at a current of approximately 20 A to 50 A.

The inductive attenuation, including magnetic hysteresis losses, may be achieved due to a permeable property of the ferrite ceramic. Consequently, the operating principle may also be based on a permeable effect.

A further operating principle that may have an attenuating effect on spurious radiation may be based on electrical conductivity. In this context, an attenuating effect is achieved by induced eddy currents, in particular, by high-frequency eddy currents. Depending on the desired type of effect, a combination of ferritic material having a particular conductivity may be produced. Apart from the inductive effect of the ferritic material, the electrical conductivity also produces dissipative attenuation. In the case of dissipative attenuation, energy is additionally removed from the electromagnetic interference by the induced eddy currents. The production of electrical conductivity may be achieved, for example, by the metallic contacts at lateral surface 203 of attenuation element 107. The attenuation element itself, not just its contact surfaces, is also made of a material having a conductivity. The conductivity of the attenuation element may be low.

Capacitive attenuation may be used as a further operating principle. A dielectric ceramic may be used instead of, or in addition to, a ferritic ceramic. In this case, on one hand, the resting of attenuation element 107 against both cover device 102 and contact device 106a, 106b produces a capacitor Cy 401, 402 effective at high frequencies, between contact device 106a, 106b and aluminum block 102 in the form of a device ground. Contact device 106a, 106b may be a lead wire. On the other hand, the resting of the attenuation element against conductors 106a, 106b forms a capacitor Cx between conductors 106a, 106b or contact tabs 106a, 106b.

An element 107, which has both dielectric and permeable properties, may also be used as an attenuation element 107. In this manner, an integrated filter element having a capacitive and inductive attenuation effect may be provided by a single component, e.g., made out of a single material, which has both dielectric and permeable properties. The use of a single material allows a monolithic component to be produced.

In the case of capacitive attenuation, a mainly energy-retaining resonance in the considered frequency range is prevented, which means that the attenuation element is configured to remove energy that is present in spurious radiation.

Attenuation device 107 may be constructed so as to have multiple pieces. For example, by using at least two attenuation elements, which have different attenuation characteristics or attenuation effects and are positioned one behind the other in an axial direction with respect to the longitudinal axis of attenuation device 107, a common, heterogeneous attenuation element may be produced. In this connection, a first part I of attenuation device 107 may be a capacitively acting element, and the second part II may be an inductively acting element. Parts I and II may be structurally separated by a boundary layer. For example, an attenuation element 107 of overall length 1 may be formed out of at least two elements connected in series, having each a fraction of the length 1; in an assembled state, the fractions adding up to overall length 1. Thus, for example, one part of element 107 of length ½ may be manufactured from a capacitively acting material, and a further part of element 107 of length ½ may be manufactured from an inductively acting material, which means that when the parts are assembled, an element 107 of overall length 1 is produced. In this context, the series connection is based on a direction of propagation of the electromagnetic wave. For example, in FIG. 2a, region I of length ½ is capacitively active, and region II of length ½ is inductively active. In this connection, two shorter elements 107 connected one behind the other in an axial direction produce a series connection of a capacitively acting element I and an inductively acting element II. Alternatively, such a series circuit may also be implementable, in that during the production of a corresponding, sintered element, a powder may be axially arranged in two or more layers. Therefore, during production, different powdered materials having dielectric and permeable properties are used. During the sintering process, the different layers of the powder conglomerate to form a layered attenuation device of overall length 1, and form a single, but layered element 107.

Attenuation element 107 may be made of ceramic material and/or of a plastic-bonded powder mixture. The powder mixture may have dielectric and/or magnetic properties. However, the powder mixture may also have insulating properties or a low conductivity.

The plastic-bonded powder mixture may be a powder having a dielectric constant of 10-100, in an epoxy resin. The magnitude of capacitances Cx 403 and Cy 401, 402 may be increased, using, on one hand, the physical distance between electrodes 102, 106a, 106b and the material selected. A material having a high epsilon value may produce a high capacitance.

In the case of a capacitively acting element 107, one must pay attention that aluminum block 102, as an outer conductor, and all inner conductors 106a, 106b, are connected to dielectric 107 so as to be as free of air gaps as possible. In this context, aluminum block 102 as outer conductor and contact device 106a, 106b as inner conductor constitute electrodes, which are connected to attenuation device 107 so as to be essentially free of air gaps.

In order to allow an air-gap-free connection of electrodes 106a, 106b, 102 to attenuation element 107, the attenuation element may be provided with a metallic layer on essentially all electrode contact surfaces. In this context, the metallic layer may be vapor-deposited on the surfaces, e.g., on lateral surface 203 or on the inner surfaces of contact passage 201, 202. By providing attenuation element 107 with a metallic layer on all of the electrode contact surfaces, complete surface contact may be dispensed with. The electrode contact surfaces may be individual contact points between the metallized surface of element 107 and cover 102. Therefore, it is sufficient to provide at least one electrode contact surface on lateral surface 203 of attenuation element 107 and/or on the surface of contact openings 201, 202, which have a metallic layer. Thus, individual point contacts may be provided, since the metallic layer ensures a good electrical connection. On the contact surfaces, the surfaces of attenuation device 107 may have slight elevations, which are then provided with a metallic layer and are able to produce individual point contacts or surface contacts. The elevations may be built-up areas of an outer diameter of attenuation device 107 or of contacts 106a, 106b, or narrowed areas of the inner diameter of opening 105 or of contact passages 201, 202.

In order to ensure an essentially air-gap-free connection of dielectric 107, in particular, of attenuation element 107, dielectric element 107 may be provided with thin-walled sheet-metal parts on essentially all electrode contact surfaces. The thin-walled sheet-metal parts may also produce effective contacting with electrodes 102, 106a, 106b. In a further exemplary embodiment, these sheet-metal parts may be provided with at least one elastic point contact, using partial punching, through which the contacting is improved.

For further or alternative contacting of electrodes 102, 106a, 106b with dielectric 107 that is as free of air gaps as possible, the contact surfaces may also be surface-cemented to electrodes 102, 106a, 106b with the aid of a conductive adhesive. The cementing simultaneously allows a rigid mechanical mounting of element 107 in opening 105, which substantially prevents the element from shifting along a longitudinal axis.

The different options for air-gap-free connection of electrodes 102, 106a, 106b to dielectric 107 may be combined in any manner desired. An air-gap-free connection may be a connection, which has good conductivity but is not necessarily formed completely without an air gap and/or a gap. In the planning of an attenuation element 107, corresponding contact points may already be defined, via which a corresponding contact is then produced with the aid of the vapor-deposited, metallic layer, the electrode contact surface or the conductive adhesive.

Attenuation element 107 may be bidirectionally active. Not only may it attenuate electromagnetic radiation traveling outwards 104 from hollow space 103, but it may also render possible electromagnetic sealing of interior space of the motor 103 with respect to control unit 108. That is, spurious electromagnetic radiation generated by control unit 108, e.g., in the range of 3 GHz, may be prevented from penetrating in the direction of hollow space 103. In other words, upon passage through attenuation element 107, the energy of an electromagnetic radiation generated by control unit 108 may be reduced in such a manner, that inside hollow space 103, this attenuated radiation does not have a significant effect on electronic components. Consequently, separate attenuation of control unit 108 or inside of control unit 108 may be avoided.

Due to the mechanical sealing action obtained through the close fit in the opening, interior space 103 may be mechanically sealed with respect to external space 104, and thus, for example, the movement of carbon dust and/or brake fluid vapors from motor 100 into control unit 108 and/or vice versa may be prevented.

In the ESP hydraulics, cover device 102 may be, for example, 88 mm in length, 100 mm in width and 30 mm in height. In the example of an ABS (antilock brake system), cover device 102 may be 88 mm in length, 68 mm in width and 30 mm in height. Further hydraulic block dimensions are conceivable. The height essentially corresponds to opening 105 and may be selected to be between approximately 30 mm and 50 mm.

The capacitance of the capacitor Cy produced by attenuation element 107 is approximately 200 pF. The attenuation element may provide HF (high frequency) engineering and/or mechanical isolation of interior space 103 from external space 104. In addition to attenuation element 107, ferrite beads inside the motor may be provided as attenuation elements, in particular, for the lower frequency range of the electromagnetic radiation. The attenuation effect may be made up of an attenuation internal to the motor and an attenuation external to the motor.

Attenuation element 107 may ensure an imperviousness to carbon brush dust, which is produced in interior space of the motor 103 by abrasion, for example, and may simultaneously bring about the attenuation.

Figure 5:
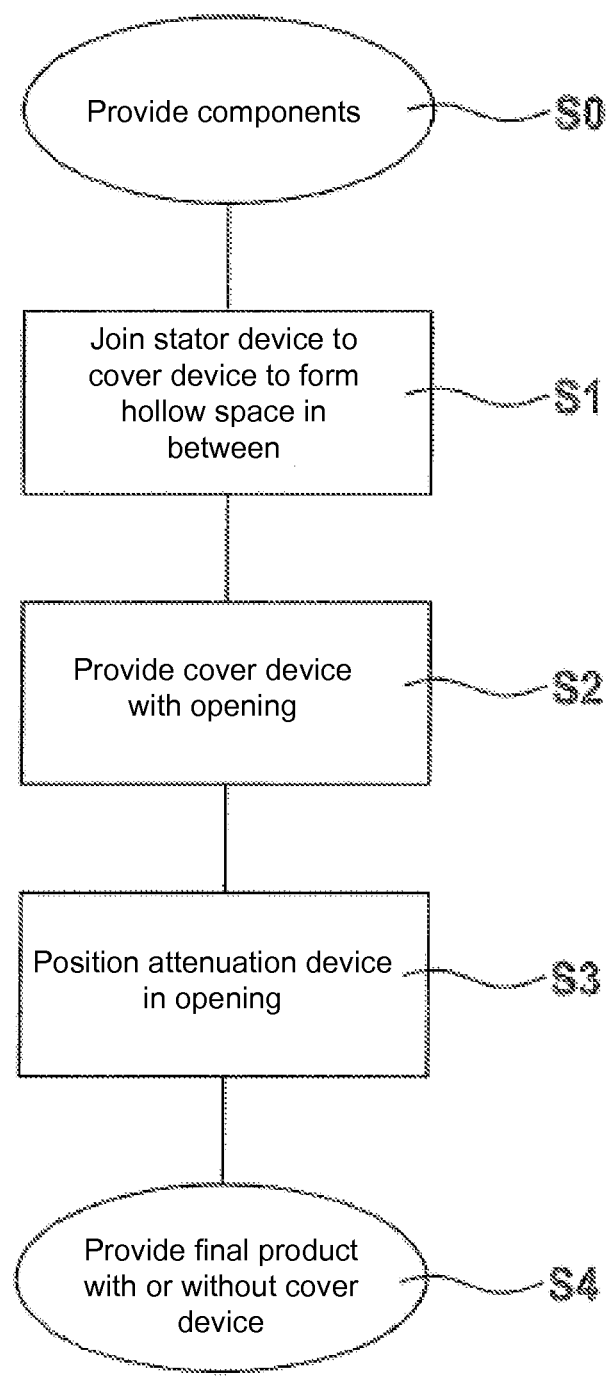
FIG. 5 shows a flow chart of a method for manufacturing an actuator apparatus according to an exemplary embodiment of the present invention.

FIG. 5 shows a flowchart of a method for manufacturing an actuator apparatus. Starting out from a first state S0 in which the components are provided, in a step S1, a stator device is joined to a cover device in such a manner, that a hollow space 103 is formed between the stator device and the cover device. For example, during the pre-assembly, the motor may already be spatially bounded by a bearing cover that supports the A-bearing, which means that a motor prepared in such a manner is already provided in step S0.

In a further step S2, cover device 102 is provided with an opening 105, in particular, a bore 105, through which a contact device 106a, 106b may be guided into hollow space 103, so that contact device 106a, 106b runs at least partially in hollow space 103 and at least partially in cover device 102. Opening 105 may have already been formed during the manufacture of the ingot of the cover device, so that in essence, only block 102 still has to be provided.

In step S3, an attenuation device 107 is positioned in opening 105 in such a manner, that high-frequency electromagnetic radiation that travels through opening 105 is more highly attenuated by attenuation device 107 than the radiation would be attenuated without the presence of attenuation device 107.

In step S4, the manufacturing method is ended and the final product is provided either with or without contact device 106a, 106b.

The manufacturing method may also be altered, so that the manufacture of the cover device with opening 105 and attenuation device 107 takes place prior to attaching stator device 101 to cover device 102. This procedure may simplify the introduction of attenuation device 107 into cover device 102, in particular, if attenuation device 107 is produced by integrally casting or molding it into opening 105. In this instance, it may be useful to provide the contact device prior to introducing the attenuation device, since the former is surrounded by the attenuation device.

In addition, it should be pointed out that "including" and "having" do not exclude any other elements or steps, and that "a" or "an" does not exclude a plurality. Furthermore, it should be emphasized that features or steps, which have been described with reference to one of the exemplary embodiments above, may also be used in combination with other features of other exemplary embodiments described above. Reference characters in the claims are not to be regarded as a limitation.

What is claimed is:

1. An actuator apparatus, comprising:
a stator device;
a cover device;
a contact device including two lead wires; and
an attenuation device;
wherein:
the stator device and the cover device are joined so that a hollow space is formed between the stator device and the cover device;
the cover device has a first opening, through which the contact device is guided together with the lead wires into the hollow space, so that the contact device runs at least partially in the hollow space and at least partially in the cover device;
a width of the first opening is larger than a combined width of the two lead wires;
the hollow space has no other openings besides the first opening;
the attenuation device is positioned in the first opening so that electromagnetic radiation, which is generated in the hollow space and travels through the first opening, is more highly attenuated by the attenuation device than the radiation would be attenuated without the presence of the attenuation device;
a body of the attenuation device is formed of a material that is dimensioned such that, when the body is positioned in the first opening, the attenuation device attenuates at a frequency of the electromagnetic radiation generated in the hollow space; and
the body of the attenuation device surrounds the contact device while mechanically sealing the hollow space by forming a seal around an inner surface of the first opening.

2. The actuator apparatus of claim 1, wherein the electromagnetic radiation, which the attenuation device is configured to attenuate, is generated by a motor component located in the hollow space and moves away from the hollow space through the first opening.

3. The actuator apparatus of claim 1, wherein the attenuation device has a resistance of at least 20 kOhm.

4. The actuator apparatus of claim 1, wherein the stator device is a pole pot.

5. The actuator apparatus of claim 1, further comprising:
a control device, wherein the control device is positioned at the contact device so that the attenuation device is situated between the hollow space and the control device.

6. The actuator apparatus of claim 1, wherein the attenuation device is adapted to at least one of the stator device and the cover device so that the attenuation device substantially attenuates the electromagnetic radiation, which is blocked by the at least one of the stator device and the cover device.

7. The actuator apparatus of claim 1, wherein the attenuation device provides at least one of the following types of attenuation: inductive attenuation;
capacitive attenuation; and conductivity based attenuation.

8. The actuator apparatus of claim 1, wherein the attenuation device has at least one of a plastic-bonded powder mixture and a ceramic.

9. The actuator apparatus of claim 1, wherein at its surface, the attenuation device has at least one of the following contacts: a metallic layer; a thin-walled metal sheet; a thin-walled metal sheet having at least one elastic point contact; and conductive adhesive.

10. The actuator apparatus of claim 1, wherein the attenuation device is formed in a plurality of pieces.

11. The actuator apparatus of claim 10, wherein the pieces include a piece of inductive material in contact with a piece of capacitive material.

12. The actuator apparatus of claim 1, wherein the attenuation device forms a capacitor between the two lead wires.

13. The actuator apparatus of claim 12, wherein the attenuation device forms a second capacitor between a first one of the lead wires and the cover device, and a third capacitor between a second one of the lead wires and the cover device.

14. The actuator apparatus of claim 1, wherein the attenuation device forms a capacitor between the contact device and the cover device.

15. The actuator apparatus of claim 1, wherein the attenuation device provides inductive attenuation, including magnetic hysteresis losses.

16. The actuator apparatus of claim 1, wherein:
the attenuation device is a cylinder that includes second and third openings through which the two lead wires respectively pass;
the cylinder is sized such that there are substantially no air gaps between the attenuation device and the first opening; and
the second and the third openings are sized such that there are substantially no air gaps between each of the second and the third openings and a corresponding one of the two lead wires.

17. The actuator apparatus of claim 1, wherein a surface of the attenuation device includes a screw thread that engages a corresponding screw thread in the first opening.

18. A method for manufacturing an actuator apparatus, the method comprising:
joining a stator device to a cover device so that a hollow space is formed between the stator device and the cover device;
providing the cover device with an opening, through which a contact device including two lead wires is guided, together with the lead wires, into the hollow space, so that the contact device runs at least partially in the hollow space and at least partially in the cover device; and
positioning an attenuation device in the opening so that a body of the attenuation device surrounds the contact device while mechanically sealing the hollow space by forming a seal around an inner surface of the opening, and so that electromagnetic radiation that is generated in the hollow space and travels through the opening is more highly attenuated by the attenuation device than the radiation would be attenuated without the presence of the attenuation device;
wherein:
the body of the attenuation device is dimensioned such that when the body is positioned in the first opening, the attenuation device attenuates at a frequency of the electromagnetic radiation generated in the hollow space;
a width of the opening is larger than a combined width of the two lead wires; and
the hollow space has no other openings besides the opening.

19. The method of claim 18, wherein the attenuation device is at least one of cast and cemented so as to position it in the opening.

* * * * *